(12) United States Patent
Bourstein

(10) Patent No.: US 8,866,501 B2
(45) Date of Patent: Oct. 21, 2014

(54) METHOD AND APPARATUS FOR TESTING INTEGRATED CIRCUITS

(75) Inventor: Ido Bourstein, Pardes Hana (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 370 days.

(21) Appl. No.: 13/215,447

(22) Filed: Aug. 23, 2011

(65) Prior Publication Data

US 2012/0049873 A1    Mar. 1, 2012

Related U.S. Application Data

(60) Provisional application No. 61/378,358, filed on Aug. 30, 2010.

(51) Int. Cl.
*G01R 31/00*     (2006.01)
*G01R 31/30*     (2006.01)
(52) U.S. Cl.
CPC .................. *G01R 31/3004* (2013.01)
USPC ........................................ 324/750.01
(58) Field of Classification Search
None
See application file for complete search history.

(56) References Cited

U.S. PATENT DOCUMENTS

2008/0024159 A1* 1/2008 Tilbor et al. .............. 324/99 R
2009/0251123 A1* 10/2009 Henson et al. ............. 323/311

* cited by examiner

*Primary Examiner* — Melissa Koval
*Assistant Examiner* — Courtney McDonnough

(57) ABSTRACT

A method for testing an electronic device includes supplying a first voltage output from a voltage regulator to a first power connection terminal of the electronic device to provide power to the electronic device, providing to the voltage regulator a second voltage on a second power connection terminal of the electronic device that is in connection with the first power connection terminal by a first circuit of the electronic device, regulating, using the voltage regulator, the first voltage based on a comparison of the second voltage and a target voltage, and determining whether the electronic device meets a performance requirement while the first voltage is regulated.

20 Claims, 4 Drawing Sheets

US 8,866,501 B2

METHOD AND APPARATUS FOR TESTING INTEGRATED CIRCUITS

INCORPORATION BY REFERENCE

This application claims the benefit of U.S. Provisional Application No. 61/378,358, "Enhanced Method for Voltage Compensation in a Tester" filed on Aug. 30, 2010, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Generally, integrated circuits (IC) testing uses automated test equipment (ATE) and an adapter board specific to an integrated circuits product to test each device under test (DUT) of the product. In an example, each packaged IC device of a product can be inserted into a socket on the adapter board, and the adapter board is suitably connected to the ATE. Then, the ATE tests the packaged IC device via the adapter board. For example, the ATE sends test signals to the packaged IC device and receives response signals from the packaged IC device via the adapter board.

SUMMARY

Aspects of the disclosure provide a method for testing an electronic device. The method includes supplying a first voltage output from a voltage regulator to a first power connection terminal of the electronic device to provide power to the electronic device, providing to the voltage regulator a second voltage on a second power connection terminal of the electronic device that is in connection with the first power connection terminal by a first circuit of the electronic device, regulating, using the voltage regulator, the first voltage based on a comparison of the second voltage and a target voltage, and determining whether the electronic device meets a performance requirement while the first voltage is regulated.

To determine whether the electronic device meets the performance requirement while the first voltage is regulated, the method includes sending test signals to first signal terminals of the electronic device, and receiving response signals from second signal terminals of the electronic device.

In an embodiment, the method includes supplying a third voltage output from the voltage regulator to a third power connection terminal of the electronic device, providing to the voltage regulator a fourth voltage on a fourth power connection terminal of the electronic device that is in connection with the third power connection terminal by a second circuit of the electronic device, and regulating, using the voltage regulator, at least one of the first voltage and the third voltage based on a voltage differential between the second voltage and the fourth voltage. In an example, the method includes regulating, using the voltage regulator, at least one of the first voltage and the third voltage so as to cause the voltage differential between the second voltage and the fourth voltage to be equal to the target voltage.

Aspects of the disclosure provide an integrated circuit (IC) that is tested according to the method.

Aspects of the disclosure also provide a test system for testing a device under test (DUT). The test system includes a tester, a voltage regulator controller and an adapter board configured for testing the DUT. The adapter board includes a first conductive path configured to supply a first voltage output from a voltage regulator to a first power connection terminal of the DUT to provide power to the DUT, and a second conductive path configured to provide to the voltage regulator the second voltage on a second power connection terminal of the DUT that is in connection with the first power connection terminal by a first circuit within the DUT. The voltage regulator controller is configured to cause the voltage regulator to regulate the first voltage based on the second voltage received by the voltage regulator and a target voltage. The tester is configured to perform a functional test of a circuit on the DUT while the first voltage is regulated.

In an embodiment, the adapter board further includes multiple testing paths configured to send the test signals generated by the tester to first signal connection terminals of the DUT and to receive response signals from second signal connection terminals of the DUT.

According to an aspect of the disclosure, the adapter board includes a third conductive path configured to supply a third voltage output from the voltage regulator to a third power connection terminal of the DUT, and a fourth conductive path configured to provide to the voltage regulator a fourth voltage on a fourth power connection terminal of the DUT that is in connection with the third power connection terminal by a second circuit within the DUT.

Aspects of the disclosure also provide the adapter board that is configured to test the DUT.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
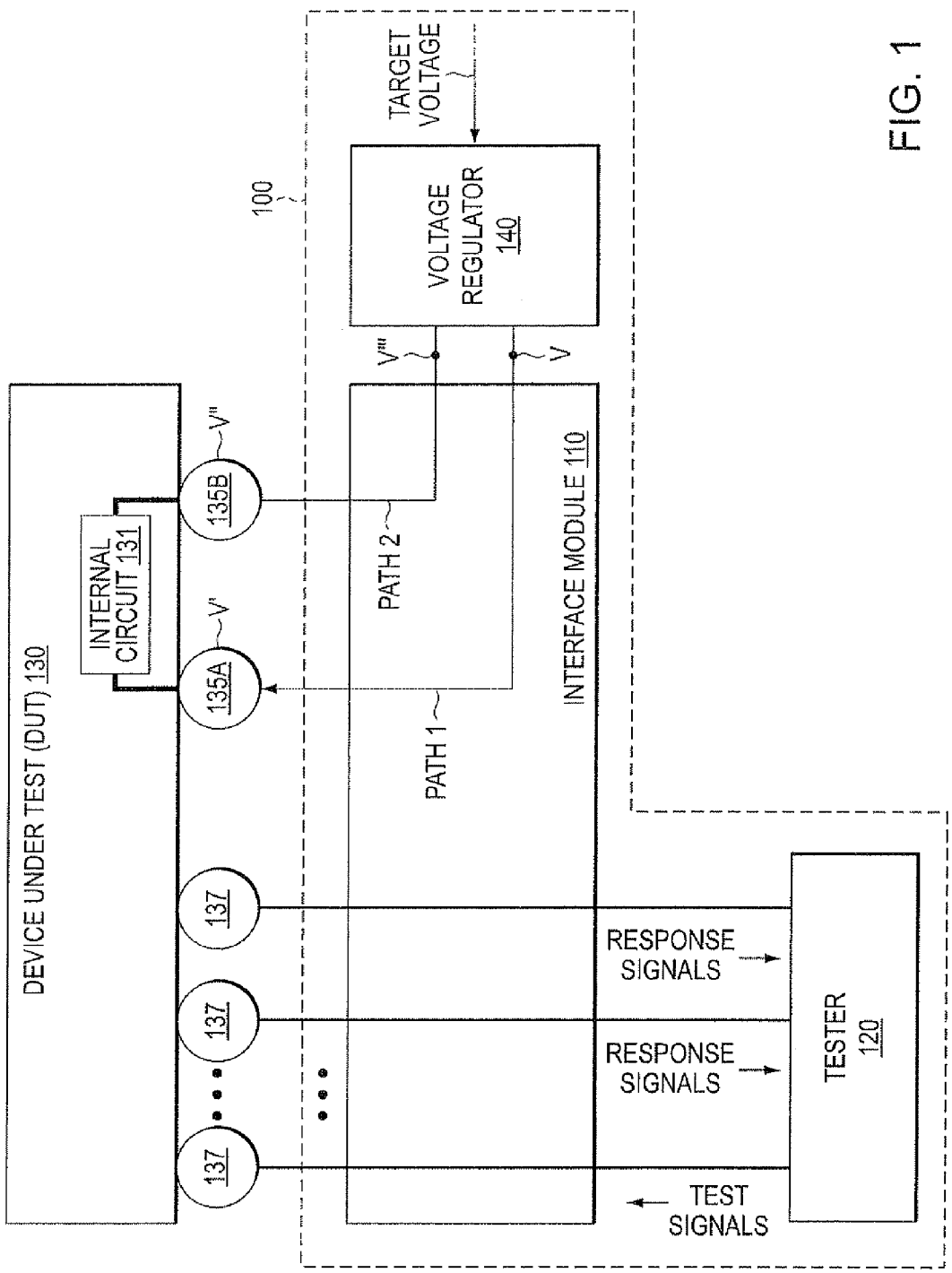
FIG. 1 shows a block diagram of a test system example 100 according to an embodiment of the disclosure.

FIG. 1 shows a block diagram of a test system example 100 that tests a device under test (DUT) 130 according to an embodiment of the disclosure. The test system 100 includes a tester 120, a voltage regulator 140, and an interface module 110. These elements are coupled together as shown in FIG. 1.

The DUT 130 can be any suitable device, such as an integrated circuit (IC) chip, a packaged IC device, and the like. The DUT 130 includes connection terminals, such as signal connection terminals 137, and power connection terminals 135A and 135B, and the like. In an example, the connection terminals 137, 135A and 135B are pads on an IC chip. In another example, the connection terminals 137, 135A and 135B are pins of a pin grid array (PGA) package. In another example, the connection terminals 137, 135A and 135B are solder balls of a ball grid array (BGA) package.

According to an aspect of the disclosure, the power connection terminals 135A and 135B are configured to have substantially the same voltage potential during operation. In an embodiment, the power connection terminals 135A and 135B are configured to provide a power supply, such as VDD, VSS, and the like, to circuits within the DUT 130 during operation. In an example, the power connection terminals 135A and 135B are coupled together internally by an internal circuit 131 of the DUT 130, such as an internal power bus, a power distribution grid, a pad bonded to the two terminals, and the like. Thus, a voltage V" on the power connection terminal 135B is a function of a voltage V' on the power connection terminal 135A. In an embodiment, the voltage V' on the power connection terminal 135A is substantially the same as the voltage V" on the power connection terminal 135B. It is noted that the DUT 130 can include other power connection terminals that are configured to provide other power supply of same or different voltage, such as ground and the like.

The interface module 110 provides suitable interfaces for coupling the voltage regulator 140 and the tester 120 with the DUT 130 during testing to test the DUT 130. In an embodiment, the interface module 110 is an adapter board having printed circuits coupled with probe contactors. The interface module 110 is suitably configured to connect selected terminals on the DUT 130 to the tester 120 and the voltage regulator 140. The interface module 110 is installed on a prober (not shown). The prober is suitably connected to the tester 120 and the voltage regulator 140 via suitable connectors, such as Universal Serial Bus (USB), Peripheral Component Interconnect (PCI), PCI Extensions for Instrumentation (PXI), Local Area Network (LAN), General Purpose Interface Bus (GPIB), and the like. Further, the prober is suitably configured to force the probe contactors to make electrical contacts with the signal connection terminals 137, and the power connection terminal 135A and 135B.

In another example, the interface module 110 is an adapter board having printed circuits coupled with a socket. The socket has suitable contactors, such as pin contactors configured to make electrical contacts with pins, solder ball contactors configured to make electrical contacts with solder balls, and the like. The interface module 110 is installed on a handler (not shown) and the handler is suitably connected with the tester 120 and the voltage regulator 140 via suitable connectors, such as USB, PCI, PXI, LAN, GPIB, and the like. During testing, the DUT 130 is plugged into the socket, and the contactors of the socket are forced to make electrical contacts with the signal connection terminals 137 and the power connection terminals 135A and 135B.

The interface module 110 includes various leads, such as solder traces, wires, cables, ribbon cable, jumpers, and the like, and suitable electrical components, such as resistors, capacitors, diodes, transistors, and the like, that form paths, such as conductive paths, signal traces and the like, between the DUT 130 and the tester 120 or the DUT 130 and the voltage regulator 140.

According to an embodiment of the disclosure, the interface module 110 includes separate paths PATH1 and PATH2 that are suitably configured to respectively interface the power connection terminals 135A and 135B with the voltage regulator 140. For example, in an embodiment, the path PATH1 is configured to have relatively high conductivity for providing power supply to the power connection terminal 135A and the path PATH2 is configured to prevent direct current flowing through, such that a voltage drop on the path PATH2 is substantially equal to zero. In an example, the path PATH1 includes printed wires of relatively large width and/or thickness. The path PATH2 is connected to a sense pin of the voltage regulator 140 that has relatively high input impedance, such that no current flows on the path PATH2 and the voltage drop on the path PATH2 is substantially equal to zero. In another embodiment, the path PATH2 includes a buffer (not shown) configured to have relatively high input impedance to prevent current flowing through. In another embodiment, the path PATH2 includes a low pass filter (not shown) to remove noises.

The voltage regulator 140 is configured to provide one or more power supplies to the DUT 130. In addition, in an embodiment, the voltage regulator 140 includes one or more sense pins configured to have relatively high input impedance. The voltage regulator 140 is configured to sense voltages provided on the sense pins. In an example, the path PATH2 is coupled to a sense pin of the voltage regulator 140. According to an aspect of the disclosure, the voltage regulator 140 is configured to adjust a voltage V of a power supply output to the path PATH1 based on a voltage V''' received from the path PATH2. In addition, in an embodiment, the voltage regulator 140 receives a target voltage that is a reference voltage. Then, the voltage regulator 140 regulates the voltage V output to the path PATH1 based on a comparison of the voltage V''' received from the path PATH2 and the target voltage. In an example, the voltage regulator 140 regulates the voltage V output to the path PATH1 to cause the voltage V''' received from the path PATH2 to be equal to the target voltage.

In an embodiment, the tester 120 is configured to provide test signals to the DUT 130 via the interface module 110 and to receive response signals of the DUT 130 via the interface module 110. Based on the response signals, the tester 120 then determines whether the DUT 130 passes or fails tests. It is noted that the paths on the interface module 110 for delivering the test signals and the response signals are suitably configured according to suitable signal delivering requirements.

According to an aspect of the disclosure, contact resistance of the contactors on the interface module 110 with the connection terminals 137, 135A and 135B on the DUT 130 may vary. In an example, contact resistance is different for different DUTs 130 of same design. In another example, when the contactors are released from a first contact with a DUT 130, and are forced to make a second contact with the same DUT 130, such as during a retest, the contact resistance of the first contact is different from the contact resistance of the second contact.

According to an embodiment of the disclosure, the power connection terminals 135A and 135B, the internal circuit 131, the paths PATH1 and PATH2 and the voltage regulator 140 form a feedback loop during testing. The feedback loop is configured to compensate for variation, such as the contact resistance variation, temperature variation, and the like, and thus to keep the voltage V' of the power supply within the DUT 130 to be substantially the same, for different DUTs 130 or for retests.

During testing, in an example, the voltage regulator 140 outputs the power supply having the voltage V to the path PATH1. The path PATH1 is configured to deliver the power supply to the power connection terminal 135A. The path PATH1 has a voltage drop that varies for a different DUT 130 or retest due to the variation of the contact resistance, for example. Thus, the voltage V' on the power connection terminal 135A is different from the voltage V output to the path PATH1. Further, the voltage V" on the power connection terminal 135B is substantially the same as the voltage V' on the power connection terminal 135A. The voltage V" is sensed and feedback by the path PATH2 to the voltage regulator 140. In an example, the path PATH2 is configured to have substantially zero voltage drop, thus the voltage V''' received by the voltage regulator 140 from the path PATH2 is substantially the same as the voltage V'' on the power connection terminal 135B. Then, the voltage regulator 140 regulates the voltage V provided to the path PATH1 based on the voltage V''' received from the path PATH2. It is noted that, in an example, when the voltage regulator 140 regulates the voltage V provided to the path PATH1 to keep the voltage V''' to be a specific value, the voltage V' on the power connection terminal 135A is also equal to the specific value.

In an example, the voltage regulator 140 receives a target voltage, and regulates the voltage V provided to the path PATH1 to cause the voltage received from the path PATH2 to be equal to the target voltage, or some other predefined relationship to the target voltage. Thus, the voltage V' on the power connection terminal 135A is equal to the target voltage.

Further, in an embodiment, while simultaneously to monitoring and adjusting the voltage V, the tester 120 provides test signals to the DUT 130 and receives response signals from the DUT 130. Based on the response signals, the tester 120 determines whether the DUT 130 passes or fails the tests. Thus, for a different DUT 130 or a retest, tests are taken under substantially the same power supply condition that the voltage V' on the power connection terminal 135A is substantially the same, for example, being equal to the target voltage or some other predefined relationship to the target voltage.

It is noted that, in an example, different DUTs 130 consume different current due to process variation, temperature variation, and the like. In another example, different tests, such as different test vectors, and the like, cause the same DUT 130 to consume different current. The different current causes the voltage drops on the path PATH1 to be different. In the example, the voltage regulator 140 regulates the voltage V provided to the path PATH1 to cause the voltage V''' received from the path PATH2 to be equal to the target voltage or some other predefined relationship to the target voltage. Thus, in an embodiment, the voltage V' on the power connection terminal 135A can be maintained at substantially the same level for different DUTs 130, and for different tests so as to provide a controlled testing environment.

Figure 2:
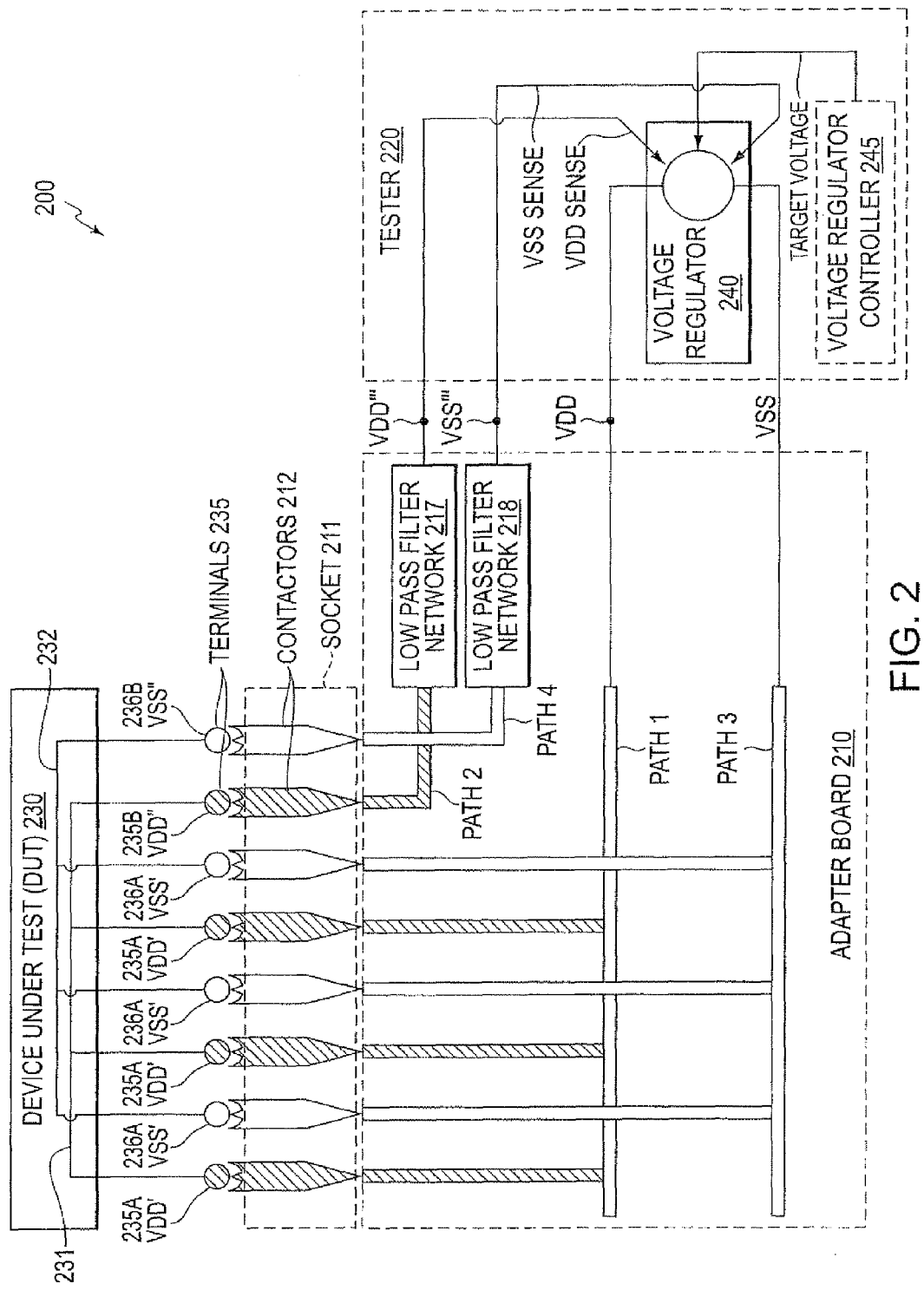
FIG. 2 shows a block diagram of another test system example 200 according to an embodiment of the disclosure.

FIG. 2 shows a block diagram of another test system example 200 for testing a DUT 230 according to an embodiment of the disclosure. The test system 200 includes a tester 220, and a handler (not shown). An adapter board 210 with a socket 211 is suitably installed on the handler to interface the tester 220 with the DUT 230. The tester 220 includes a voltage regulator 240 for providing power supplies during testing. These elements are coupled together as shown in FIG. 2.

In the FIG. 2 example, the DUT 230 is in a ball grid array (BGA) package with solder balls 235A, 235B, 236A and 236B. The DUT 230 includes a first power bus 231 and a second power bus 232. In the FIG. 2 example, the first power bus 231 is a VDD bus that couples the solder balls 235A and 235B, such that a voltage VDD' on the solder balls 235A is substantially the same as a voltage VDD'' on the solder ball 235B. Similarly, the second power bus 232 is a VSS bus that couples the solder balls 236A and 236B, such that a voltage VSS' on the solder balls 236A is substantially the same as a voltage VSS'' on the solder ball 236B.

The adapter board 210 with the socket 211 includes various leads and suitable circuit components that form conductive paths, signal traces, and the like between the DUT 230 and the tester 220.

Specifically, in an example, the socket 211 includes ball contactors 212 configured to make electrical contacts with the solder balls 235A, 235B, 236A and 236B of the DUT 230. According to an embodiment of the disclosure, the contact resistance of the ball contactors 212 to the solder balls 235A, 235B, 236A and 236E of the DUT 230 varies for different DUT 230. In addition, when the solder ball contactors 212 are released from a first contact and then are forced to make a second contact with the solder balls 235A, 235B, 236A and 236B of the same DUT 230, the contact resistance of the first contact can be different from the contact resistance of the second contact.

Further, in the FIG. 2 example, the adapter board 210 includes a first path PATH1 for interfacing the solder balls 235A with the voltage regulator 240 and a second path PATH2 for interfacing the solder ball 235B with the voltage regulator 240. The first path PATH1 delivers a power supply provided by the voltage regulator 240 to the solder balls 235A, and the second path PATH2 delivers a sensed voltage on the solder balls 235B back to the voltage regulator 240. Further, the adapter board 210 includes a third path PATH3 for interfacing the solder balls 236A with the voltage regulator 240 and a fourth path PATH4 for interfacing the solder ball 236B with the voltage regulator 240. The third path PATH3 delivers a power supply, such as Ground, provided by the voltage regulator 240 to the solder balls 236A, and the fourth path PATH4 delivers a sensed voltage on the solder balls 23613 back to the voltage regulator 240.

According to an embodiment of the disclosure, the paths PATH1, PATH2, PATH3 and PATH4 are suitably configured according to signal or power delivering requirements. For example, in an embodiment, the first path PATH1 includes first printed wires in a first layer of the adapter board 210. The first layer has relatively large thickness, and the first printed wires have relatively large width. Thus, the first path PATH1 is configured to have relatively good conductivity. Similarly, the third path PATH3 includes second printed wires in a second layer. The second layer has relatively large thickness, and the second printed wires have relatively large width. Thus, the third path PATH3 has relatively good conductivity. However, the first path PATH1 and the third path PATH3 have voltage drops or rises. In addition, due to the variation of the contact resistance, the voltage drops also vary. Specifically, in an example, the voltage regulator 240 provides a voltage VDD, for example, a positive voltage, to the first path PATH1 for delivering, and the voltage VDD drops to the voltage VDD' on the solder balls 235A. Similarly, the voltage regulator 240 provides a voltage VSS, such as Ground, a negative voltage, and the like, to the third path PATH3 for delivering, and the voltage VSS rises to the voltage VSS' on the solder balls 236A.

In another embodiment, a voltage differential changes due to the voltage drop and/or rise on the first path PATH1 and the third path PATH3, and the variation of the contact resistance. Specifically, in an example, the voltage regulator 240 provides a voltage VDD, for example, a positive voltage, to the first path PATH1 for delivering, and the voltage VDD drops to the voltage VDU on the solder balls 235A. Similarly, the voltage regulator 240 provides a voltage VSS, such as Ground, a negative voltage, and the like, to the third path PATH3 for delivering, and the voltage VSS rises to the voltage VSS' on the solder balls 236A. A voltage differential of the voltage VDU on the solder balls 235A to the voltage VSS' on the solder balls 236A varies as a function of the voltage drop on the first path PATH1, the voltage rise on the third path PATH3, and the variation of the contact resistance.

Further, the second path PATH2 and the fourth path PATH4 are configured to deliver the sensed voltages to the voltage regulator 240. In an embodiment, the second path PATH2 and the fourth path PATH4 are connected to the sense pins of the voltage regulator 240. The sense pins are configured to have relatively high input impedance, such that there is no current on the second path PATH2 and the fourth path PATH4, and voltage drops on the second path PATH2 and the fourth path PATH4 are substantially equal to zero. Thus, a voltage VDD''' received by the voltage regulator 240 from the second path PATH2 is substantially the same as the voltage VDD'' on the solder ball 235B, and a voltage VSS''' received by the voltage regulator 240 from the fourth path PATH4 is substantially the same as the voltage VSS'' on the solder ball 236B. It is noted that, in an example, the second path PATH2 and the fourth path PATH4 may include suitable circuits, such as buffers, to prevent direct current flowing there through.

In addition, in an embodiment, the second path PATH2 includes a low pass filter network 217, and the fourth path PATH4 includes a low pass filter network 218. The low pass filter networks 217 and 218 are configured to reduce noises in the delivered voltage signals. It is noted that, in another embodiment, the low pass filter networks 217 and 218 are omitted.

The voltage regulator 240 is configured to provide power supplies to the DUT 230. In addition, in an embodiment, the voltage regulator 240 includes sense pins configured to have relatively high input impedance. The voltage regulator 240 is configured to sense voltages provided on the sense pins. In an example, the second path PATH2 and the fourth path PATH4 are respectively coupled to sense pins of the voltage regulator 240. According to an aspect of the disclosure, the voltage regulator 240 is configured to adjust the voltage VDD of a first power supply output to the first path PATH1 based on the voltage VDD''' received from the second path PATH2, and adjust the voltage VSS of a second power supply output to the third path PATH3 based on the voltage VSS''' received from the fourth path PATH4.

In addition, in an embodiment, the voltage regulator 240 receives one or more target voltages that are reference voltages, and regulates the voltage VDD and the voltage VSS based on comparisons of the voltages VDD''' and VSS''' to the one or more target voltages. In an example, the voltage regulator receives a first target voltage and a second target voltage that are reference voltages. The voltage regulator 240 regulates the voltage VDD to cause the voltage VDD''' to be equal to the first target voltage, and regulates the voltage VSS to cause the voltage VSS''' to be equal to the second target voltage. In another example, the voltage regulator 240 regulates at least one of the voltages VDD and VSS based on a comparison of the sensed voltage differential (VDD'''-VSS''') and the target voltage. In an example, the voltage regulator 240 regulates the voltage VDD output to the first path PATH1 and the voltage VSS output to the third path PATH3 to cause the voltage differential (VDD'''-VSS''') received from the second path PATH2 and the fourth path PATH4 to be equal to the target voltage.

It is noted that the adapter board 210 can include other paths (not shown) for providing test signals from the tester 220 to the DUT 230, and/or providing response signals from the DUT 230 to the tester 220. In an embodiment, while maintaining the voltage differential (VDD'''-VSS''') at a controlled level, various functional tests, such as logic tests, memory tests, and the like are performed on circuitry in the DUT 230. Based on the response signals, the tester 220 then determines whether the DUT 230 passes or fails tests.

According to an aspect of the disclosure, contact resistance of the ball contactors 212 with the solder balls on the DUT 230 varies. In an example, contact resistance is different for different DUT 230. In another example, contact resistance is different when contactors are released from a first contact with a DUT 230, and are forced to make a second contact with the same DUT 230, for example, during a retest.

According to an embodiment of the disclosure, the solder balls 235A and 235B, the first power bus 231, the first path PATH1, the second path PATH2 and the voltage regulator 240 form a first feedback loop during testing. The first feedback loop is configured to compensate for the variation of the contact resistance, and thus to keep the voltage VDD' on the solder balls 235A to be substantially the same for different DUT 230 or for a retest. Further, the solder balls 236A and 236B, the second power bus 232, the third path PATH3, the fourth path PATH4 and the voltage regulator 240 form a second feedback loop during testing. The second feedback loop is configured to compensate for the variation of the contact resistance, and thus to keep the voltage VSS' on the solder balls 236A to be substantially the same for different DUT 230 or for a retest.

Specifically, during testing, the voltage regulator 240 provides the voltage VDD onto the first path PATH1 of the adapter board 210. The first path PATH1 delivers the voltage VDD' onto the solder balls 235A of the DUT 230 that provides a positive power supply to internal circuits of the DUT 230. It is noted that, in an example, due to the voltage drop on the first path PATH1, the voltage VDD' on the solder balls 235A is different from the voltage VDD provided by the voltage regulator 240 onto the first path PATH1. In addition, due to the variation of the contact resistance, the voltage drop from the voltage VDD to the voltage VDD' may vary from DUT to DUT or from test to test.

Further, the voltage VDD'' on the solder ball 235B is substantially the same as the voltage VDD' on the solder balls 235A, and the second path PATH2 is configured, in an embodiment, to have substantially zero voltage drop, thus the voltage VDD''' received by the voltage regulator 240 is substantially equal to the voltage VDD'' on the solder ball 235B and is substantially equal to the voltage VDD' on the solder ball 235A. Then, the voltage regulator 240 regulates the voltage VDD supplied to the first path PATH1 based on the voltage VDD''' to keep the voltage VDD' on the solder ball 235A to be substantially the same for different DUT 230 or retests, for example.

Similarly, the voltage regulator 240 provides the voltage VSS onto the third path PATH3 of the adapter board 210. The third path PATH3 delivers the voltage VSS' onto the solder balls 236A of the DUT 230 that provides, for example, Ground to internal circuits of the DUT 230. It is noted that, in an example, due to the voltage rise on the third path PATH3, the voltage VSS' on the solder balls 236A is different from the voltage VSS provided by the voltage regulator 240 onto the third path PATH3. In addition, due to the variation of the contact resistance, the voltage rise from the voltage VSS to the voltage VSS' may vary.

Further, the voltage VSS'' on the solder ball 236B is substantially the same as the voltage VSS' on the solder balls 236A, and the fourth path PATH4 is configured to have substantially zero voltage rise, thus the voltage VSS''' received by the voltage regulator 240 is substantially equal to the voltage VSS'' on the solder ball 236B and is substantially equal to the voltage VSS' on the solder ball 236A. Then, the voltage regulator 240 regulates the voltage VSS supplied to the third path PATH3 based on the voltage VSS''' to keep the voltage VSS' on the solder ball 236A to be substantially the same for different DUT 230 or retests, for example.

In an example, the voltage regulator 240 receives a target voltage that is a reference voltage, and regulates at least one of the voltage VDD supplied to the first path PATH1 and the voltage VSS supplied to the third path PATH3 to cause the voltage differential (VDD'''-VSS''') received from the second path PATH2 and the fourth path PATH4 to be equal to the target voltage. Thus, the voltage differential (VDD'-VSS') to the internal circuits of the DUT is substantially equal to the target voltage.

In an embodiment, the tester 220 waits for a time period for the voltage regulator 240 to stably maintain the voltage differential (VDD'''-VSS''') equal to the target voltage. Then, the tester 220 provides test signals to the DUT 230 and receives response signals from the DUT 230 through signal leads, which are not seen in FIG. 2. Based on the response signals, the tester 220 determines whether the DUT 230 passes or fails the tests.

In an embodiment, the test system 200 includes a voltage regulator controller 245. The voltage regulator controller 245 provides control parameters, such as the target voltage, and the like, to the voltage regulator 240 to cause the voltage regulator 240 to regulate its output voltages in a desired manner, for example, as a function of input voltages. It is noted that the voltage regulator controller 245 can be implemented in various portions of the test system 200, such as in the tester 220, on the adapter board 210, within the voltage regulator 240, and the like.

Figure 3:
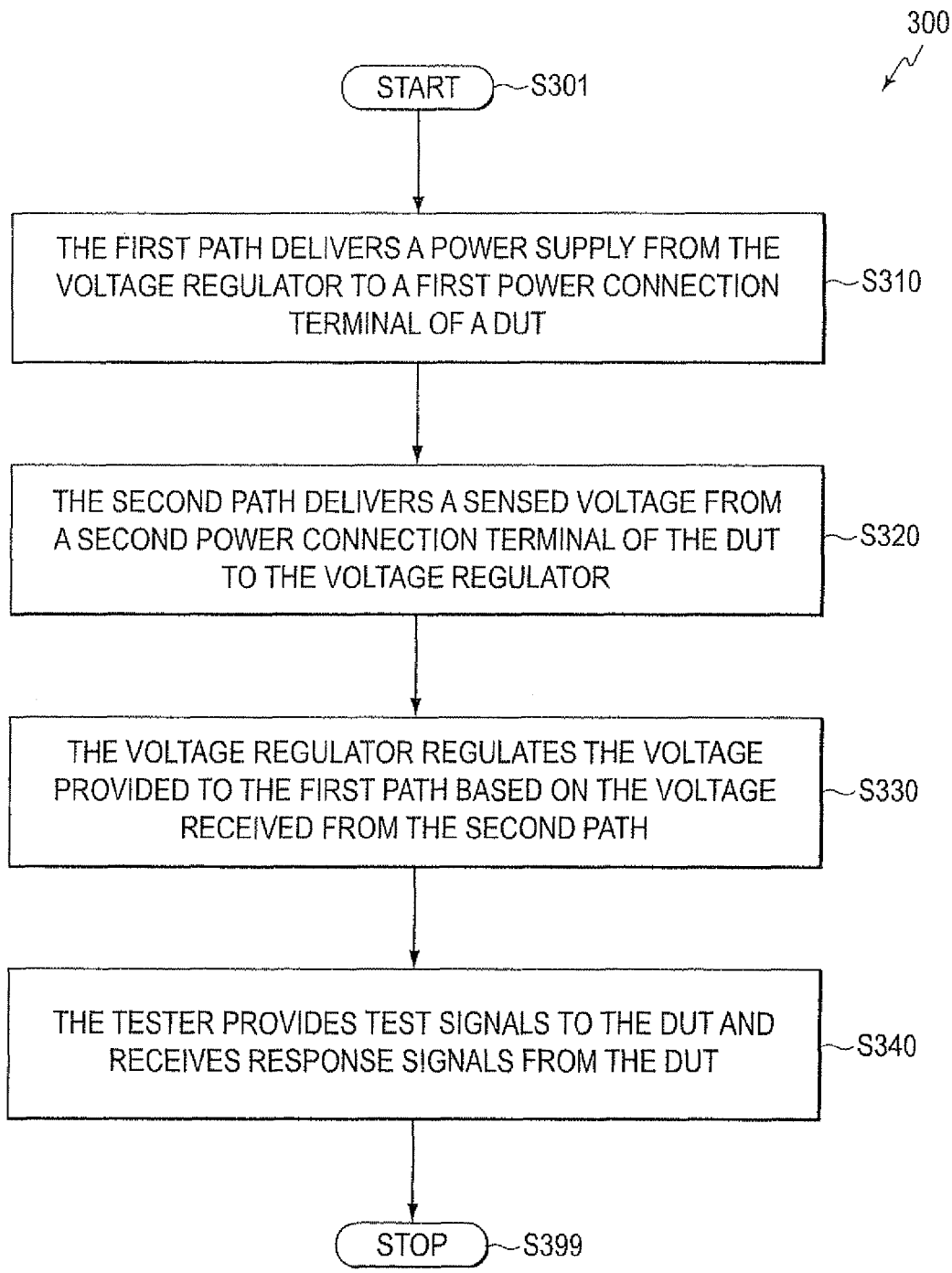
FIG. 3 shows a flowchart outlining a process example 300 for the test system 100 to test the device under test (DUT) 130 according to an embodiment of the disclosure.

FIG. 3 shows a flowchart outlining a process example 300 for the test system 100 to test the DUT 130 according to an embodiment of the disclosure. The process starts at S301 and proceeds to S310.

At S310, the first path PATH1 delivers a power supply from the voltage regulator 140 to a first power connection terminal, such as a power connection terminal 135A of a DUT 130. Specifically, the voltage regulator 140 generates the power supply having the voltage V, and supplies the voltage V onto the first path PATH1 of the interface module 110. In an embodiment, the first path PATH1 is configured to have relatively large conductivity for delivering the power supply. However, due to the current flowing through the first path PATH1, the first path PATH1 has a voltage drop, and the voltage V' on the power connection terminal 135A in FIG. 1 is different from the voltage V supplied to the first path PATH1. In addition, due to the variation of the contact resistance of a contactor on the interface module 110 with the power connection terminal 135A, the voltage drop of voltage actually supplied to the DUT 130 may be different for different DUTs 130 or retests. Within the DUT 130, the internal circuit 131 couples the power connection terminal 135A with the power connection terminal 136B, thus the voltage V'' on the power connection terminal 135B is substantially the same as the voltage V' on the power connection terminal 135A.

At S320, the second path PATH2 delivers a sensed voltage from a second power connection terminal, such as the power connection terminal 135B, of the DUT 130 in FIG. 1 to the voltage regulator 140. Specifically, the second path PATH2 is configured to connect to the tester sense input which is a high impedance pin, thus the voltage drop on the second path PATH2 is substantially equal to zero. Thus, the voltage V''' received by the voltage regulator 140 from the second path PATH2 is substantially equal to the voltage V'' on the power connection terminal 135B, and is substantially equal to the voltage V' on the power connection terminal 135A.

At S330, in an embodiment, the voltage regulator 140 regulates the voltage V supplied to the first path PATH1 based on the voltage V''' received from the second path PATH2. In an embodiment, the voltage regulator 140 regulates the voltage V supplied to the first path PATH1 to keep the voltage V''' received from the second path PATH2 to be substantially the same for different DUT 130 or retests. Thus, the voltage V' on the power connection terminal 135A is kept substantially the same for different DUTs 130 or retests. In an example, the voltage regulator 140 receives a target voltage, and regulates the voltage V supplied to the first path PATH1 to keep the voltage V''' equal to the target voltage. Thus, the voltage V' on the power connection terminal 135A is substantially equal to the target voltage for different DUT 130 or retests.

At S340, in an embodiment, the tester 120 provides test signals to signal connection terminals 137 of the DUT 130 and receives response signals from the signal connection terminals 137. In an embodiment, when the voltage regulator 140 stably regulates the voltage V supplied to the first path PATH1 to keep the voltage V''' received from the second path PATH2 equal to the target voltage, the tester 120 provides test signals to signal connection terminals 137 of the DUT 130 and receives response signals from the signal connection terminals 137. Based on the response signals, the tester 120 determines whether the DUT 130 passes or fails the tests. Then the process proceeds to S399 and terminates.

Figure 4:
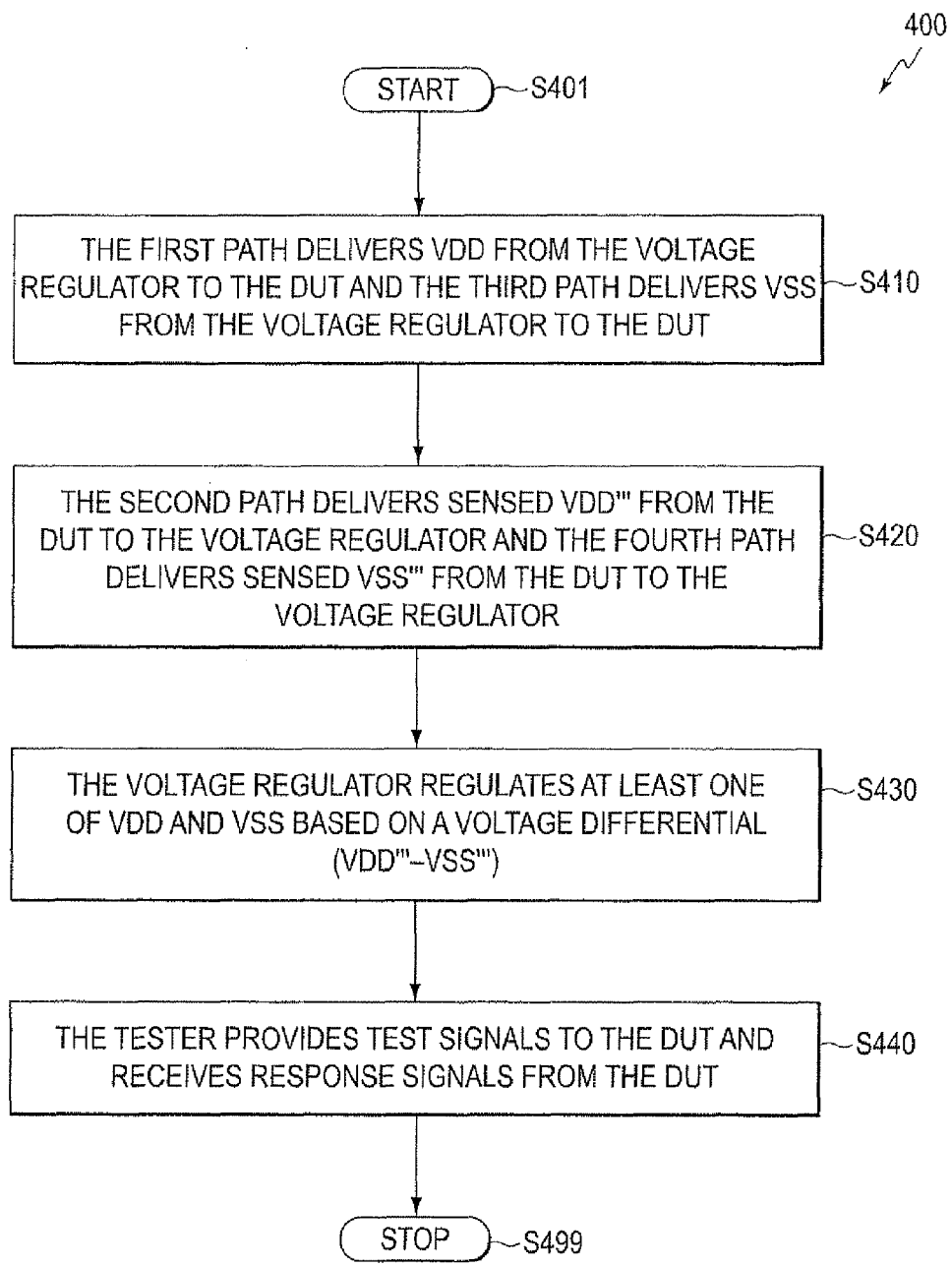
FIG. 4 shows a flowchart outlining a process example 400 for the test system 200 to test the DUT 230 according to an embodiment of the disclosure.

FIG. 4 shows a flowchart outlining a process example 400 for the test system 200 to test the DUT 230 according to an embodiment of the disclosure. The process starts at S401 and proceeds to S410.

At S410, the first path PATH1 delivers the power supply VDD from the voltage regulator 240 to the power connection terminal 235A of the DUT 230, and the third path PATH3 delivers the power supply VSS from the voltage regulator 240 to the power connection terminal 236A of a DUT 230.

At S420, the second path PATH2 delivers a sensed voltage VDD''' from the power connection terminal 23513, of the DUT 230 to the voltage regulator 240 and the fourth path PATH4 delivers a sensed voltage VSS''' from the power connection terminal 236B, of the DUT 230 to the voltage regulator 240.

At S430, the voltage regulator 240 regulates at least one of VDD and VSS based on a voltage differential (VDD'''-VSS'''). In an embodiment, the voltage regulator 240 regulates at least one of VDD and VSS to maintain the voltage differential (VDD'''-VSS''') to be substantially the same for different DUT 230 or retests. In an example, the voltage regulator 240 receives the reference target voltage, and regulates at least one of VDD and VSS to keep the voltage differential (VDD'''-VSS''') to be substantially equal to the reference target voltage.

At S440, the tester 220 provides test signals to the DUT 230 and receives response signals from the DUT 230 while maintaining the voltage differential at a controlled level. Based on the response signals, the tester 220 determines whether the DUT 230 passes or fails the tests. Then the process proceeds to S399 and terminates.

While the invention has been described in conjunction with the specific embodiments thereof that are proposed as examples, it is evident that many alternatives, modifications, and variations will be apparent to those skilled in the art. Accordingly, embodiments of the invention as set forth herein are intended to be illustrative, not limiting. There are changes that may be made without departing from the scope of the invention.

What is claimed is:

1. A method for testing an electronic device, comprising:
supplying a first voltage output directly from a voltage regulator to a first power connection terminal of the electronic device via a first conductive path to provide power to the electronic device;
providing directly to the voltage regulator a second voltage on a second power connection terminal of the electronic device that is in connection with the first power connection terminal by a first circuit of the electronic device via a second conductive path having a conductivity that is substantially lower than that of the first conductive path;

regulating, using the voltage regulator, the first voltage based on a comparison of the second voltage and a target voltage; and determining whether the electronic device meets a performance requirement while the first voltage is regulated.

2. The method of claim 1, wherein determining whether the electronic device meets the performance requirement while the first voltage is regulated, further comprises:

sending test signals to first signal terminals of the electronic device; and receiving response signals from second signal terminals of the electronic device.

3. The method of claim 1, wherein providing the second voltage on the second power connection terminal of the electronic device further comprises at least one of:

buffering the second voltage sensed on the second power connection terminal; and filtering the second voltage sensed on the second power connection terminal to allow low frequency components to pass.

4. The method of claim 1, further comprising:

providing the second voltage to the voltage regulator and regulating, at the voltage regulator, the first voltage so as to cause the second voltage to be equal to the target voltage.

5. The method of claim 1, further comprising:

supplying a third voltage output from the voltage regulator to a third power connection terminal of the electronic device;

providing to the voltage regulator a fourth voltage on a fourth power connection terminal of the electronic device that is in connection with the third power connection terminal by a second circuit of the electronic device; and regulating, using the voltage regulator, the third voltage based on a comparison of the fourth voltage and a second target voltage.

6. The method of claim 5, further comprising:

providing the second voltage to the voltage regulator and regulating, at the voltage regulator, the first voltage so as to cause the second voltage to be equal to the target voltage; and providing the fourth voltage to the voltage regulator and regulating, at the voltage regulator, the third voltage so as to cause the fourth voltage to be equal to the second target voltage.

7. The method of claim 1, further comprising:

supplying a third voltage output from the voltage regulator to a third power connection terminal of the electronic device;

providing to the voltage regulator a fourth voltage on a fourth power connection terminal of the electronic device that is in connection with the third power connection terminal by a second circuit of the electronic device; and regulating, using the voltage regulator, at least one of the first voltage and the third voltage based on a voltage differential between the second voltage and the fourth voltage.

8. The method of claim 7, wherein regulating, using the voltage regulator, at least one of the first voltage and third voltage based on the voltage differential between the second voltage and the fourth voltage further comprises:

regulating, using the voltage regulator, at least one of the first voltage and the third voltage so as to cause the voltage differential between the second voltage and the fourth voltage to be equal to the target voltage.

9. The method of claim 2, further comprising:

sending the test signals and receiving the response signals when the second voltage is substantially equal to the target voltage.

10. The method of claim 2, wherein supplying the first voltage output from the voltage regulator comprises at least one of:

supplying the first voltage output from the voltage regulator within a tester that generates the test signals; and supplying the first voltage output from the voltage regulator that is separate from the tester that generates the test signals.

11. A test system for testing a device under test (DUT), comprising:

an adapter board configured for testing the DUT, the adapter board including:

a first conductive path configured to supply a first voltage output directly from a voltage regulator to a first power connection terminal of the DUT to provide power to the DUT; and a second conductive path having a conductivity that is substantially lower than that of the first conductive path, the second conductive pith configured to directly provide to the voltage regulator the second voltage on a second power connection terminal of the DUT that is in connection with the first power connection terminal by a first circuit within the DUT;

a voltage regulator controller configured to cause the voltage regulator to regulate the first voltage based on the second voltage received by the voltage regulator and a target voltage; and a tester configured to perform a functional test of a circuit on the DUT while the first voltage is regulated.

12. The test system of claim 11, wherein the adapter board further includes:

multiple testing paths configured to send the test signals generated by the tester to first signal connection terminals of the DUT and to receive response signals from second signal connection terminals of the DUT.

13. The test system of claim 11, wherein the voltage regulator controller is configured to cause the voltage regulator to regulate the first voltage so as to cause the second voltage to be equal to the target voltage.

14. The test system of claim 11, wherein the adapter board further comprises:

a third conductive path configured to supply a third voltage output from the voltage regulator to a third power connection terminal of the DUT; and a fourth conductive path configured to provide to the voltage regulator a fourth voltage on a fourth power connection terminal of the DUT that is in connection with the third power connection terminal by a second circuit within the DUT.

15. The test system of claim 14, wherein the voltage regulator is configured to regulate the third voltage based on a comparison of the fourth voltage and a second target voltage.

16. The test system of claim 14, wherein the voltage regulator is configured to regulate at least one of the first voltage and the third voltage based on a voltage differential between the second voltage and the fourth voltage.

17. The test system of claim 16, wherein the voltage regulator is configured to regulate at least one of the first voltage and the third voltage so as to cause the voltage differential between the second voltage and the fourth voltage to be equal to the target voltage.

18. The test system of claim 14, wherein the tester includes the voltage regulator.

19. An integrated circuit (IC) tested by a process, the process comprising:
  supplying a first voltage output directly from a voltage regulator to a first power connection terminal of the IC via a first conductive path to provide power to the IC;
  providing directly to the voltage regulator a second voltage on a second power connection terminal of the IC that is in connection with the first power connection terminal by a first circuit of the IC via a second conductive path having a conductivity that is substantially lower than that of the first conductive path;
  regulating, using the voltage regulator, the first voltage so as to cause the second voltage to be equal to a target voltage; and
  determining whether the IC meets a performance requirement while the second voltage is equal to the target voltage.

20. The IC of claim 19, wherein the process further comprises:
  supplying a third voltage output from the voltage regulator to a third power connection terminal of the electronic device;
  providing to the voltage regulator a fourth voltage on a fourth power connection terminal of the electronic device that is in connection with the third power connection terminal by a second circuit of the electronic device; and
  regulating, using the voltage regulator, at least one of the first voltage and the third voltage so as to cause a voltage differential between the second voltage and the fourth voltage to be equal to the target voltage.

\* \* \* \* \*